United States Patent
Suzuki et al.

(10) Patent No.: US 9,036,317 B2
(45) Date of Patent: May 19, 2015

(54) ANTISTATIC DEVICE

(75) Inventors: Shingo Suzuki, Tokyo (JP); Junichi Nakamura, Tokyo (JP); Kensaku Asakura, Tokyo (JP); Takahiro Fujimori, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/009,875

(22) PCT Filed: Aug. 21, 2012

(86) PCT No.: PCT/JP2012/071024
§ 371 (c)(1),
(2), (4) Date: Oct. 4, 2013

(87) PCT Pub. No.: WO2013/042502
PCT Pub. Date: Mar. 28, 2013

(65) Prior Publication Data
US 2014/0022687 A1  Jan. 23, 2014

(30) Foreign Application Priority Data

Sep. 22, 2011 (JP) .................. 2011-206695
Jul. 31, 2012 (JP) .................. 2012-169784

(51) Int. Cl.
| H01H 47/00 | (2006.01) |
| H01T 4/12 | (2006.01) |
| H01T 1/20 | (2006.01) |
| H05K 9/00 | (2006.01) |
| H02H 9/06 | (2006.01) |

(52) U.S. Cl.
CPC .. *H01T 4/12* (2013.01); *H02H 9/06* (2013.01); *H01T 1/20* (2013.01); *H05K 9/0067* (2013.01)

(58) Field of Classification Search
USPC .................. 361/117, 212, 220, 56
See application file for complete search history.

(56) References Cited

U.S. PATENT DOCUMENTS

| 8,717,730 B2 * | 5/2014 | Ikeda ................... 361/112 |
| 2009/0002906 A1 | 1/2009 | Liu et al. |
| 2009/0002910 A1 | 1/2009 | Liu et al. |
| 2009/0002911 A1 | 1/2009 | Liu et al. |

(Continued)

FOREIGN PATENT DOCUMENTS

| JP | A-2000-77162 | 3/2000 |
| JP | A-2009-9944 | 1/2009 |
| JP | B2-4247581 | 4/2009 |

(Continued)

OTHER PUBLICATIONS

International Search Report issued in International Patent Application No. PCT/JP2012/071024 dated Oct. 23, 2012.

*Primary Examiner* — Danny Nguyen
(74) *Attorney, Agent, or Firm* — Oliff PLC

(57) ABSTRACT

To provide an antistatic device having a low capacitance, good discharge characteristics, and small variations in the discharge characteristics. In a so-called gap-type antistatic device in which a space between a pair of opposing electrodes is filled with an electrostatic protection material, a discharge inducing portion has protrusions protruding from interfaces between the opposing electrodes and the insulation substrates toward the insulation substrates and has a shape protruding on both sides of the insulation substrates. The relationship among the gap distance between the electrodes, the thicknesses of the opposing electrodes, and the protrusions of the discharge inducing portion is controlled under specific conditions.

3 Claims, 5 Drawing Sheets

(56) References Cited

U.S. PATENT DOCUMENTS

2010/0309595 A1* 12/2010 Adachi et al. .................. 361/56
2011/0222197 A1* 9/2011 Adachi et al. .................. 361/56

FOREIGN PATENT DOCUMENTS

JP  A-2010-182916  8/2010
WO  WO 2011/040435 A1  4/2011

* cited by examiner

ANTISTATIC DEVICE

TECHNICAL FIELD

The present invention relates to an antistatic device, and in particular, to an antistatic device that is suitable for use in a high-speed transmission system and for making a composite component integrated with a common mode filter.

BACKGROUND ART

In recent years, reduction in the size of and increase in the performance of electronic apparatuses have been progressing rapidly. Moreover, increase in transmission speed and reduction in drive voltage have been progressing rapidly as typically seen in high-speed transmission systems, such as USB 2.0, S-ATA 2, and HDMI. On the other hand, as reduction in the size of and reduction in the drive voltage of electronic apparatuses progress, the withstand voltages of electronic components used in the electronic apparatuses decrease. Therefore, it is technically important to protect electronic components from overvoltage, which is typified by an electrostatic pulse that occurs when a human body comes into contact with a terminal of an electronic apparatus.

To date, as protective measures against such an electrostatic pulse, a method of providing an antistatic component, such as a varistor, at a position between the ground and a line into which static electricity flows has been used. Because the frequency of signals has higher frequency in recent years, the quality of signals decreases if the antistatic component described above has a high capacitance. Therefore, it is necessary to use an antistatic component having a capacitance of 1 pF or less when the transmission speed is several hundred Mbps or higher. Moreover, it has been not been possible to use an electrostatic protection component having a high capacitance in an antenna circuit or an RF module.

Low-capacity antistatic components have been proposed in which a space between opposing electrodes is filled with an electrostatic protection material. For example, PTL 1 discloses an antistatic device in which a pair of electrodes are disposed opposite each other on an insulating substrate and a gap between the electrodes is covered with an overvoltage protection material layer.

PTL 2 discloses an antistatic device in which a composite portion is disposed between opposing portions of discharge electrodes and a ceramic multilayer substrate. The composite portion is made of a material including a metallic material and a ceramic material. The shrinkage of the metallic substrate when being fired is identical or similar to that of the opposing portions of the discharge electrodes. The shrinkage of the ceramic substrate when being fired is identical or similar to that of the material of the ceramic multilayer substrate.

CITATION LIST

Patent Literature

PTL 1: Japanese Unexamined Patent Application Publication No. 2010-182916

PTL 2: Japanese Patent No. 4247581

SUMMARY OF INVENTION

Technical Problem

In the antistatic component described in PTL 1, the gap between the electrodes is filled with the overvoltage protection material layer that is formed so as to cover the gap, and discharge occurs between the electrodes when the antistatic device performs its function. However, the antistatic component has a problem in that, for example, the discharge characteristics vary if corner portions of the electrodes, where electric fields particularly tend to concentrate, are not covered with a discharge inducing portion.

In the antistatic component described in PTL 2, a discharge start voltage is set with high precision by setting the shrinkage of the composite portion when being fired to be an intermediate shrinkage between that of the opposing portions of the discharge electrodes and that of the ceramic multilayer substrate. However, as with the component of PTL 1, the component of PTL 2 has a problem in that, for example, the discharge characteristics vary when corner portions of the electrodes, where electric fields particularly tend to concentrate, are not covered with a discharge inducing portion.

An object of the present invention, which has been achieved in such circumstances, is to provide an antistatic device that has small variations in capacitance and discharge characteristics, a low peak voltage, high productivity, and high economic efficiency.

Solution to Problem

In order to address the problem described above, the inventors found that the problem can be solved by using the following structure and achieved the invention. The structure includes a pair of discharge electrodes and a discharge inducing portion, the pair of discharge electrodes being disposed opposite each other with a gap therebetween, the gap being located between a first insulating substrate and a second insulating substrate, the discharge inducing portion being disposed at opposing portions of the pair of discharge electrodes and in a region between the opposing portions.

The pair of discharge electrodes are formed on surfaces of the insulation substrates. The discharge inducing portion has a shape such that the discharge inducing portion protrudes toward the first insulating substrate and the second insulating substrate.

In a case where a protrusion of the discharge inducing portion exists on only one of the first insulating substrate side and the second insulating substrate side, variations in the intensity of electric fields may occur at the corner portions of the electrodes, where electric fields particularly tend to concentrate. By providing the discharge inducing portion with a shape such that the discharge inducing portion protrudes toward both the first insulating substrate and the second insulating substrate, the corner portions of the electrodes, where electric fields particularly tend to concentrate, are covered with the discharge inducing portion. Therefore, variations in the discharge characteristics and the like can be suppressed.

The pair of discharge electrodes according to the present invention may be formed opposite each other on an insulating substrate extending in the same plane. Alternatively, the discharge electrodes may be formed on insulating substrates extending in different planes. In the present invention, the phrase "at opposing portions of the discharge electrodes" refers to an overlapping region (space) formed by opposing surfaces of the discharge electrodes. In the case where the discharge electrodes are formed on an insulating substrate extending in different planes, the pair of discharge electrodes may be formed so as to have an overlapping area, or the discharge electrodes may be disposed opposite each other in a diagonal direction. The phrase "region between the opposing portions" is defined as a region including an overlapping region (space) and an adjacent area, the overlapping region being formed by surfaces that overlap when the discharge electrodes, which are disposed opposite each other in a diagonal direction, are seen from a direction in which the discharge electrodes overlap.

The discharge inducing portion may have a thickness of 10 nm or more, and the discharge inducing portion may be exposed on the surface of the device. In a case where the discharge inducing portion is exposed on both sides, the thickness of the discharge inducing portion is the same as that of the device. Because it is preferable that corner portions of the discharge electrodes, where electric fields tend to concentrate, be widely covered with a discharge inducing portion, it is preferable that the thickness of the discharge inducing portion be typically in the range of about 0.1 to 40 μm.

The thicknesses of the opposing electrodes may be set to be appropriate values and are not particularly limited. Typically, the thicknesses are in the range of about 0.1 to 20 μm.

A gap distance ΔG between the opposing discharge electrodes may be determined with consideration of required discharge characteristics. Typically, the gap distance ΔG is in the range of about 0.1 to 50 μm. In order to reduce the peak voltage, it is preferable that the distance between the electrodes be in the range of about 5 to 40 μm.

The inventors measured the characteristics of the antistatic device having the structure described above and found that the antistatic device had smaller variations in discharge characteristics and a lower peak voltage than existing devices. It is estimated that such an effect is obtained due to the following reasons, although the details are still not clear.

In the inventors' opinion, in such an existing gap-type antistatic device, discharge occurs along an electric path between opposing electrodes that has the lowest resistance. In particular, discharge occurs at corner portions of the electrodes, where electric fields tend to concentrate. In contrast, when a discharge inducing portion in an antistatic device has a shape such that the discharge inducing portion protrudes toward the first insulating substrate and the second insulating substrate, corner portions of the discharge electrodes, where electric fields tend to concentrate, are covered with the discharge inducing portion. Therefore, variations in the field intensity are reduced. As a result, variations in the discharge characteristics are reduced. Moreover, the peak voltage is also reduced by controlling the gap distance ΔG.

That is, an antistatic device according to the present invention includes a pair of discharge electrodes and a discharge inducing portion, the pair of discharge electrodes being disposed opposite each other with a gap therebetween, the gap being located between a first insulating substrate and a second insulating substrate, the discharge inducing portion being disposed at opposing portions of the pair of discharge electrodes and in a region between the opposing portions. The pair of discharge inducing portions are formed on surfaces of the insulation substrates, and the discharge inducing portion has a shape such that the discharge inducing portion protrudes toward the discharge electrode first insulating substrate and the second insulating substrate. Accordingly, provided is an antistatic device that has small variations in the discharge characteristics, that is capable of reducing the peak voltage, and that has high productivity and high economic efficiency.

An embodiment of the present invention is used for a composite electronic component in which an antistatic device according to the present invention is effectively combined. An example of such a composite electronic component is a component in which an inductor device disposed in a magnetic body and an antistatic device are integrated with each other. The inductor device has a conductor pattern formed in the magnetic body. The antistatic device includes electrodes and a functional layer disposed at least between the electrodes. The electrodes are disposed opposite each other with a distance therebetween in an insulating body that is integrated with the magnetic body.

Advantageous Effects of Invention

With the present invention, an antistatic device is realized with which variations in the discharge characteristics can be reduced because corner portions of the discharge electrodes, where electric fields tend to concentrate, are covered with a discharge inducing portion and that has a lower peak voltage because a gap distance ΔG between opposing electrodes is controlled.

DESCRIPTION OF EMBODIMENT

Figure 1:
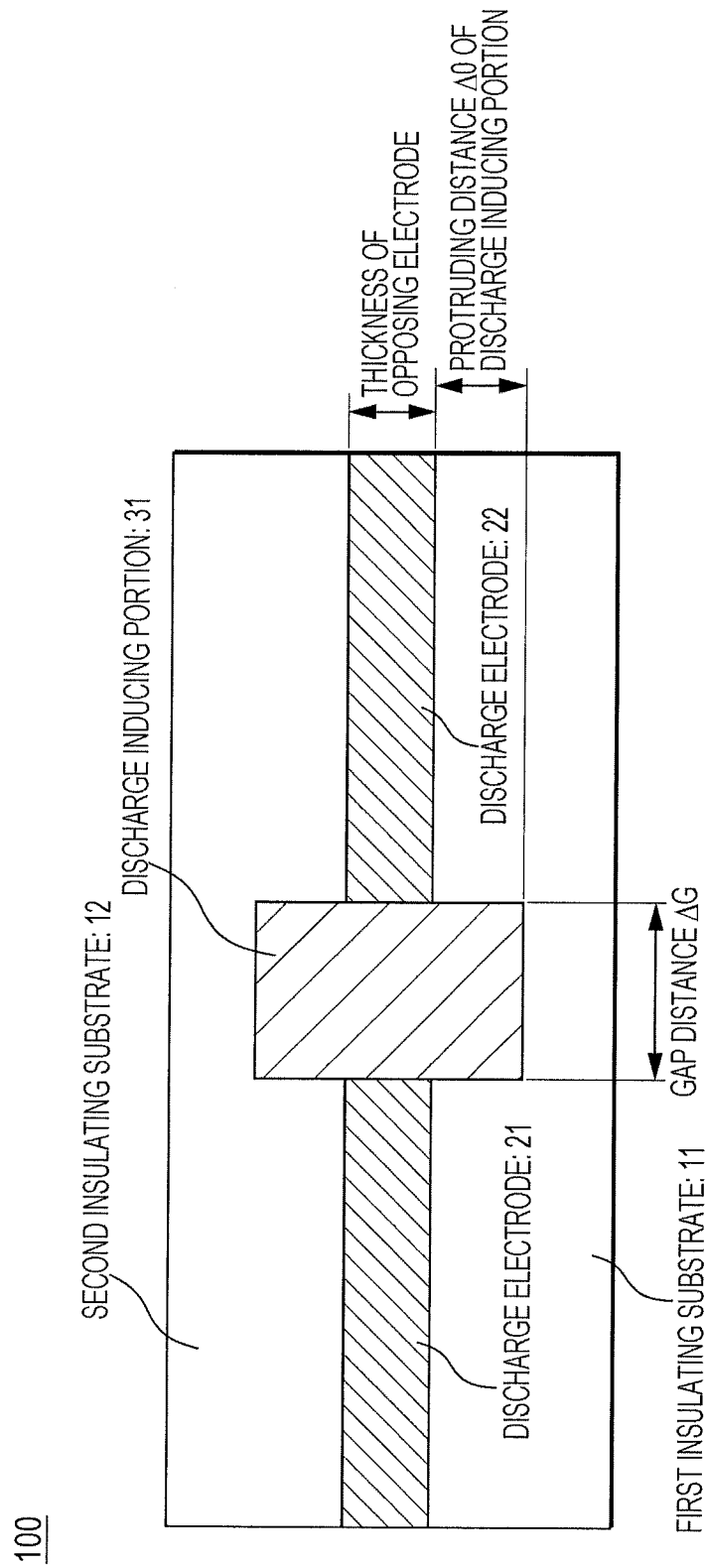
FIG. 1 is a schematic cross-sectional view illustrating an antistatic device 100.

Hereinafter, an embodiment of the present invention will be described. The same elements will be denoted by the same numerals and redundant description will be omitted. The positional relationships, such as up, down, left, and right, will be described on the basis of those shown in the drawings unless otherwise noted. The ratios of dimensions in the drawings are not limited to those shown in the drawings. The embodiment below is an example for describing the present invention, and the present invention is not limited to the embodiment.

FIG. 1 is a schematic cross-sectional view illustrating an antistatic device according to the present embodiment.

An antistatic device 100 includes a first insulating substrate 11, a pair of discharge electrodes 21 and 22 disposed on the first insulating substrate 11, a discharge inducing portion 31 disposed between the discharge electrodes 21 and 22, and terminal electrodes 41 (see FIG. 6) electrically connected to the discharge electrodes 21 and 22. In the antistatic device 100, the discharge inducing portion 31 functions as an electrostatic protection material of a low-voltage discharge type. When an overvoltage, such as static electricity, is applied, initial discharge between the discharge electrodes 21 and 22 occurs through the discharge inducing portion 31. The antistatic device 100 is made by lamination. The antistatic device 100 is used in a state in which the upper and lower surfaces of the pair of electrodes 21 and 22 are covered with an insulating material. Therefore, a protection layer, which is a second insulating substrate 12, is formed on the discharge inducing portion 31 so as to cover the discharge inducing portion 31.

Figure 4:
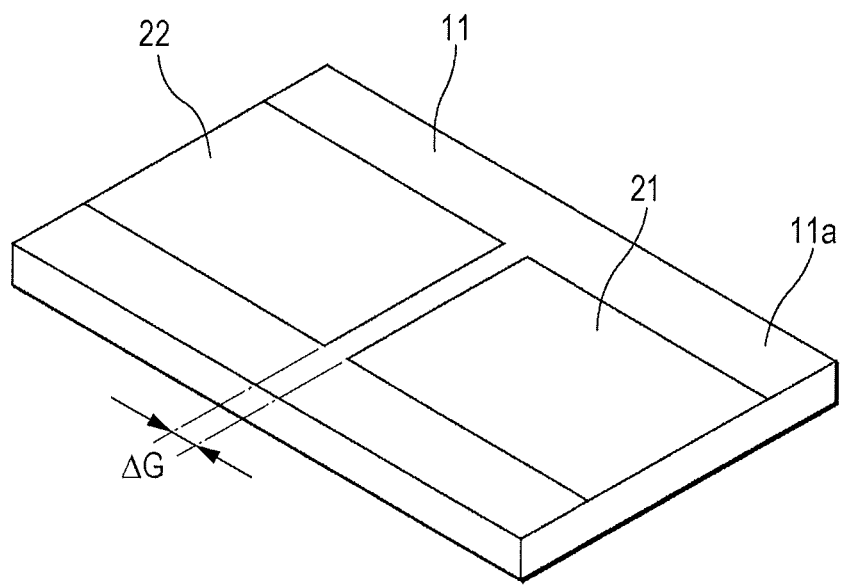
FIG. 4 is a schematic perspective view illustrating a step of manufacturing the antistatic device 100.

The first insulating substrate 11 has an insulating surface 11a (see FIG. 4). The dimensions and the shape of the first insulating substrate 11 are not particularly limited, as long as the first insulating substrate 11 can support at least the discharge electrodes 21 and 22 and the discharge inducing portion 31. The first insulating substrate 11, which has the insulating surface 11a, may be a substrate made of an insulating material or may be a substrate whose surface is partially or entirely covered with an insulating film.

Specific examples of the first insulating substrate 11 include a ceramic substrate and a single crystal substrate made of a low-permittivity material having a permittivity of 50 or less, or preferably 20 or less, such as Al2O3, SiO2, MgO, AlN, or Mg2SiO4. Alternatively, a ceramic substrate, a single crystal substrate, or the like on which an insulating film is formed may be used. The insulating film may be made of a low-permittivity material having a permittivity of 50 or less, or preferably 20 or less, such as Al2O3, SiO2, MgO, AlN, or Mg2SiO4.

On the insulating surface 11a of the first insulating substrate 11, the pair of discharge electrodes 21 and 22 are disposed so as to be separated from each other. In the present embodiment, the pair of discharge electrodes 21 and 22 are disposed opposite each other with a gap distance $\Delta G$ therebetween at substantially the center of the first insulating substrate 11 in plan view. Here, the term "gap distance $\Delta G$" refers to the minimum distance between the pair of discharge electrodes 21 and 22.

The material of the discharge electrodes 21 and 22 may be, for example, at least one metal selected from C, Ni, Al, Fe, Cu, Ti, Cr, Au, Ag, Pd, and Pt; or an alloy of these. or the like of these. However, the material is not particularly limited to these. In the present embodiment, the shape of each of the discharge electrodes 21 and 22 is rectangular in plan view. However, the shape is not particularly limited, and may be, for example, a comb-tooth shape or a saw-tooth shape.

The gap distance $\Delta G$ between the discharge electrodes 21 and 22 is not particularly limited, and may be appropriately determined with consideration of required discharge characteristics. Typically, the gap distance $\Delta G$ is in the range of about 1 to 50 μm. In order to ensure occurrence of low-voltage initial discharge, it is preferable that the gap distance $\Delta G$ be in the range of about 5 to 40 μm and more preferably in the range of about 10 to 30 μm. The thickness of each of the discharge electrodes 21 and 22 may be set to an appropriate value, and is not particularly limited. Typically, the thickness is in the range of about 1 to 20 μm.

The discharge electrodes 21 and 22 may be formed by applying a precursor made of a metal or an alloy, such as an electrode paste, and then forming a gap portion between the discharge electrodes 21 and 22 by performing laser processing or the like. Because the protruding distance $\Delta O$ of the discharge inducing portion after being fired is the same as the depth of a gap formed by gap processing, it is necessary to perform gap processing so that the depth of the gap becomes the same as $\Delta O$. A laser for forming the gap is not particularly limited, and may be selected appropriately. Specific examples of the laser include a femtosecond laser, a UV laser, and a CO2 laser.

The discharge inducing portion 31 is disposed between the discharge electrodes 21 and 22 described above. In the present embodiment, the discharge inducing portion 31 is stacked on the insulating surface 11a of the insulating substrate 11 and the discharge electrodes 21 and 22. The dimensions, the shape, and the position of the discharge inducing portion 31 are not particularly limited, as long as the discharge inducing portion 31 is designed so that initial discharge occurs between the discharge electrodes 21 and 22 through the discharge inducing portion 31 when an overvoltage is applied.

The discharge inducing portion 31 is a composite in which an insulating inorganic material is uniformly or randomly dispersed in a matrix of an insulating inorganic material. In other words, the discharge inducing portion 31 includes a conductive inorganic material that is discontinuously scattered in the matrix of an insulating inorganic material.

Specific examples of an insulating inorganic material forming a matrix include a metal oxide and a metal nitride, such as AlN. However, the insulating inorganic material is not particularly limited to these. With consideration of the insulation resistance and the cost, it is preferable that metal oxide be $Al_2O_3$, SrO, CaO, BaO, $TiO_2$, $SiO_2$, ZnO, $In_2O_3$, NiO, CoO, SfO2, $V_2O_5$, CuO, MgO, $ZrO_2$, AlN, BN, or SiC. Only one of these materials or two or more of these materials may be used. The matrix of the insulating inorganic material may be formed as a uniform film made of the insulating inorganic material or as an aggregate of particles of the insulating inorganic material. The properties of the matrix are not particularly limited. Among these, it is preferable that $Al_2O_3$, $SiO_2$, $Mg_2SiO_4$, or the like be used as the material of the insulating matrix in order to provide the insulating matrix with a high insulation resistance. It is preferable to use $TiO_2$ or ZnO in order to provide the insulating matrix with semi-conductivity. By providing the insulating matrix with semi-conductivity, it is possible to obtain an antistatic device that has good properties in terms of the discharge start voltage and the peak voltage.

Specific examples of the conductive inorganic material include a metal, an alloy, a metal oxide, a metal nitride, a metal carbide, and a metal boride. However, the conductive inorganic material is not limited to these. With consideration of the electric conductivity, it is preferable to use C, Ni, Al, Fe, Cu, Ti, Cr, Au, Ag, Pd, Pt, or an alloy of these.

According to the present invention, an antistatic device includes a pair of discharge electrodes and a discharge inducing portion, the pair of discharge electrodes being disposed opposite each other with a gap therebetween, the gap being located between a first insulating substrate and a second insulating substrate, and the discharge inducing portion being disposed at opposing portions of the pair of discharge electrodes and in a region between the opposing portions.

The pair of discharge electrodes are formed on surfaces of the insulation substrates. The discharge inducing portion has a shape such that the discharge inducing portion protrudes toward the first insulating substrate and the second insulating substrate so that corner portions of the discharge electrodes, on which electric fields tend to concentrate, are covered with the discharge inducing portion. It is preferable that the minimum protruding length of the discharge inducing portion toward each of the insulation substrates be ⅛ or more of the thickness of each of the pair of opposing discharge electrodes. Regarding the minimum protruding length of the discharge inducing portion toward the insulating substrates, it is preferable to provide a region having a length that is ⅛ or more of the thickness of each of the opposing discharge electrodes 21 and 22. The length is measured at a position at ½ of the gap distance $\Delta G$ between the discharge electrodes in FIG. 1. The length is measured from an interface between each of the opposing discharge electrodes and a corresponding one of the insulating substrates in a direction perpendicular to the interface. When the discharge inducing portion has a shape such that the protruding length is ⅛ or more of the thickness of each of the discharge electrodes, variations in the field intensity at corner portions of the electrodes are reduced and thereby variations in the discharge characteristics are reduced. The shapes of the protrusions are not particularly limited. However, it is preferable that one of the protrusions have a wedge-like shape, a semicircular shape, a quadrangular shape, or the like that protrudes toward the insulation substrates so as to cover the corner portions of the electrodes.

The thickness of the discharge inducing portion 31 is not particularly limited, and may be set to an appropriate value. In order to reduce variations in the discharge characteristics, the thickness may be 10 nm or more and the discharge inducing portion may be exposed on the surface of the device. In the case where the discharge inducing portion is exposed on both sides, it is preferable that the thickness of the discharge inducing portion be the same as that of the device.

In the antistatic device 100 according to the present embodiment, the discharge inducing portion 31, which is a composite in which a conductive inorganic material is discontinuously dispersed in a matrix of an insulating inorganic material 32, functions as a low-voltage-discharge-type electrostatic protection material. The discharge inducing portion 31 has a shape such that the discharge inducing portion 31 protrudes toward the discharge electrode first insulating substrate and the second insulating substrate. Therefore, the antistatic device 100 having high performance is realized in that it has a low capacitance, a low discharge start voltage, high durability in repeated use, and small variations in the discharge characteristics.

Figure 2:
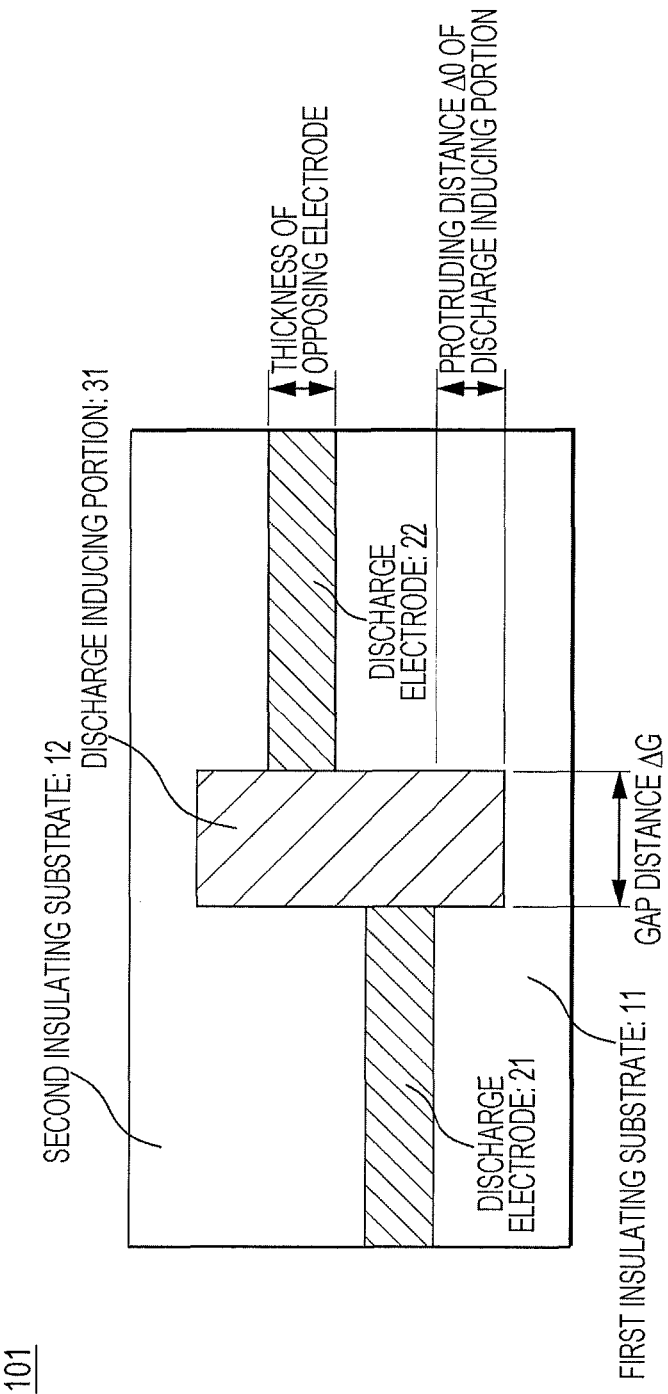
FIG. 2 is a schematic cross-sectional view illustrating a modification of the antistatic device 100.

In is not necessary that the discharge electrodes 21 and 22 be formed so as to be in the same plane. The discharge electrodes 21 and 22 may be formed as illustrated in FIG. 2 while maintaining a structure in which the discharge electrodes are disposed opposite each other.

EXAMPLES

Hereinafter, the present invention will be described in detail by using Examples. However, the present invention is not limited to the Examples.

Example 1

Figure 3:
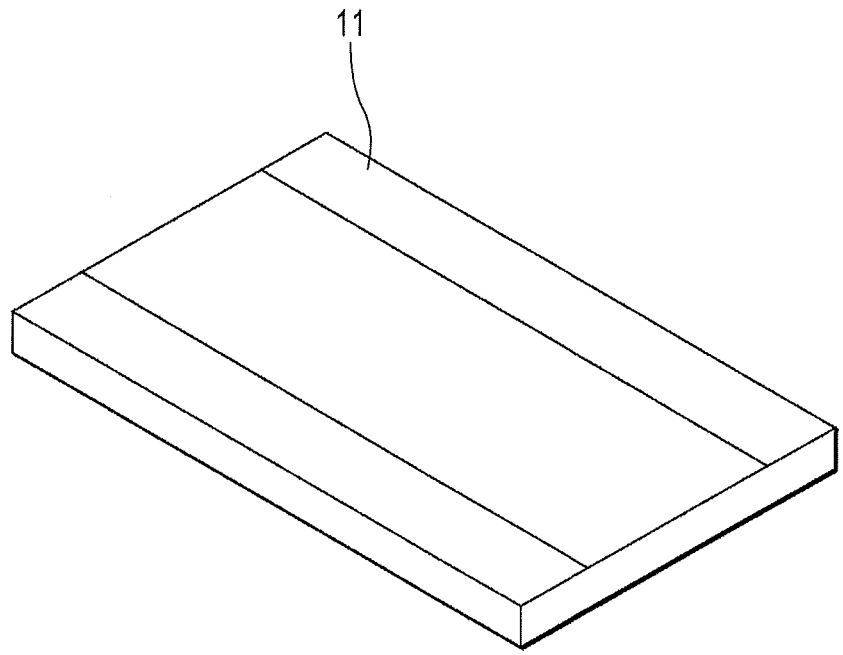
FIG. 3 is a schematic perspective view illustrating a step of manufacturing the antistatic device 100.

First, as illustrated in FIG. 3, a green sheet, which was made by forming a sheet from a material mainly composed of $Al_2O_3$ and a glass component, was prepared as the insulating substrate 11. A pattern of a strip-shaped electrode was formed by screen printing a Ag paste on the insulating surface 11a (FIG. 4) of the insulating substrate 11. The printed electrode had a length of 1 mm and a width of 0.4 mm. In order to adjust the thicknesses of the discharge electrodes after being fired, the thickness of a stencil was selected, and printing was performed so that the thickness of the discharge electrodes became 8 μm after being fired.

Next, as illustrated in FIG. 4, gap processing was performed so as to form a gap at the center of the strip-shaped electrode by using a femtosecond laser so that the gap distance became 5 μm and the depth of the gap became 2 μm after being fired. The depth of the gap after being fired was the same as the protruding distance ΔO (FIG. 1) of the discharge inducing portion after being fired. These conditions of gap processing were determined so that, after being fired, the distance by which the discharge inducing portion protruded from the upper and lower end surfaces of each of the opposing discharge electrodes 21 and 22 were 2 μm at the minimum.

Figure 5:
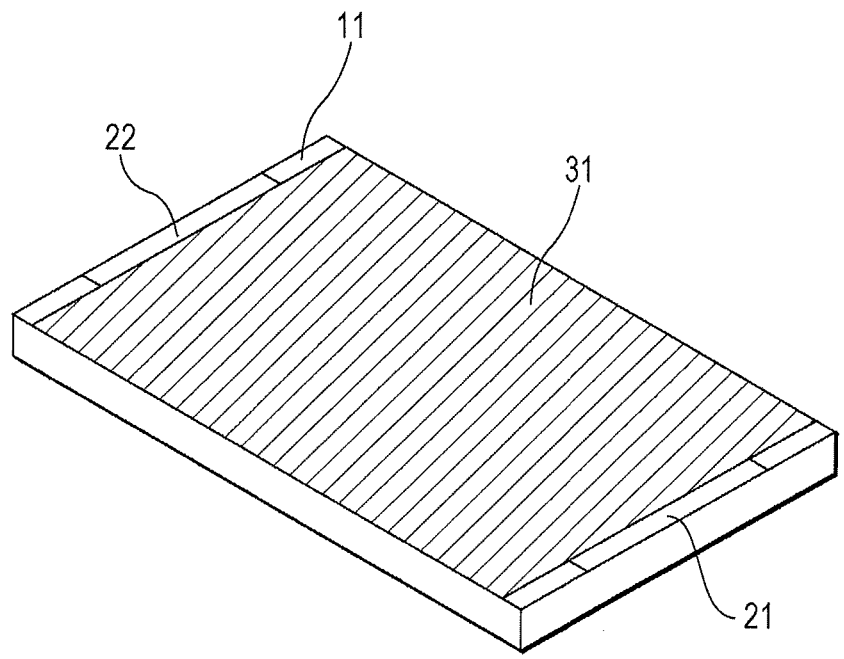
FIG. 5 is a schematic perspective view illustrating a step of manufacturing the antistatic device 100.

Next, as illustrated in FIG. 5, the discharge inducing portion 31 was formed on the first insulating substrate 11 and the discharge electrodes 21 and 22 through the following process.

First, glass particles mainly composed of $SiO_2$ (product number: ME13, made by Nihon Yamamura Glass Co., Ltd.), as the insulating inorganic material 32, and Ag particles having an average particle diameter of 0.5 μm (product number: SPQ03R, made by Mitsui Mining & Smelting Co., Ltd.), as a conductive inorganic material 33, were measured and mixed so as to respectively have volume percentages of 80 vol % and 20 vol %, thereby obtaining a mixture. In addition, a lacquer having a solid concentration of 8 wt % was made by mixing and stirring an ethyl cellulose resin as a binder with terpineol as a solvent. Next, the lacquer was added to the mixture obtained as described above, and then the resultant mixture was mixed and stirred to make a paste-like mixture.

Next, the obtained paste-like mixture was applied by screen printing so as cover the insulating surface 11a of the first insulating substrate 11 (FIG. 4) and the discharge electrodes 21 and 22, thereby forming a layer of the mixture (a precursor of the discharge inducing portion 31). Then, a multilayer body is made by stacking a green sheet on the mixture layer and heat-pressing the stack. Subsequently, the obtained multilayer body was cut into pieces having predetermined sizes. Thereafter, the temperature of the obtained pieces was increased at a rate of 10° C./min and held in the atmosphere at 950° C. for 30 minutes.

Figure 6:
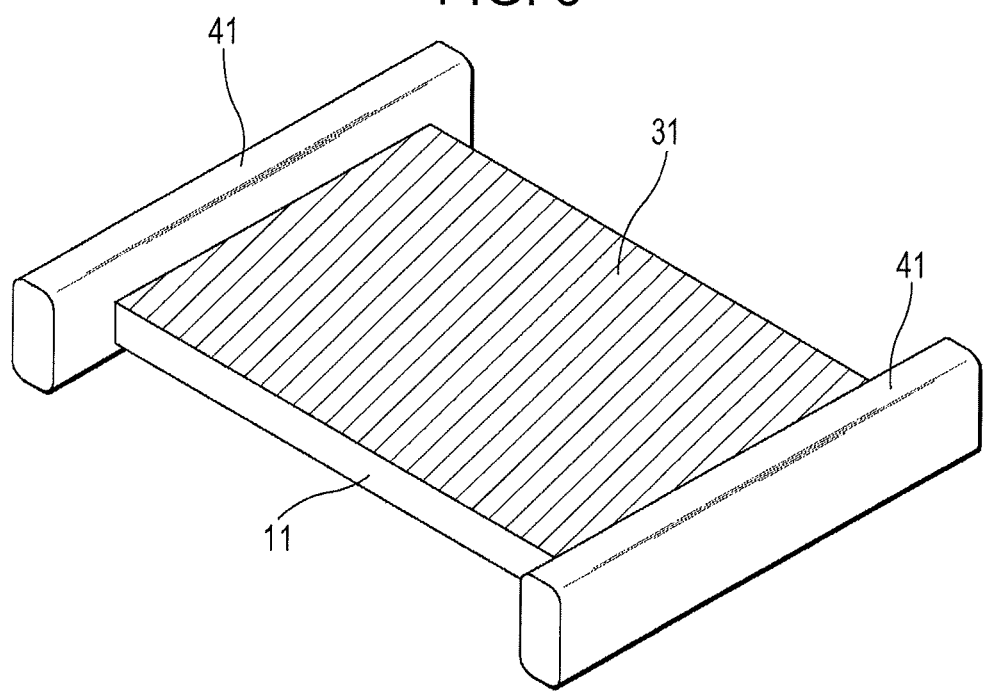
FIG. 6 is a schematic perspective view illustrating a step of manufacturing the antistatic device 100.

Subsequently, as illustrated in FIG. 6, the terminal electrodes 41, mainly composed of Ag, were formed so as to be connected to the outer peripheral portions of the discharge electrodes 21 and 22, thereby obtaining an antistatic device 100 of Example 1.

The material of the discharge electrodes 21 and 22 may be, for example, at least one metal selected from Ni, Cr, Al, Pd, Ti, Cu, Ag, Au, and Pt; or an alloy of any of these. However, the material is not particularly limited to these. In the present embodiment, each of the discharge electrodes 21 and 22 has a rectangular shape in plan view. However, the shape is not particularly limited, and may be, for example, a comb-tooth shape or a saw-tooth shape.

Example 2

An antistatic device 100 of Example 2 was obtained through a process the same as that of Example 1, except that gap processing was performed so that the gap distance became 15 μm after being fired.

Example 3

The thickness of the stencil was changed so as to adjust the thickness of the opposing electrodes to 4 μm after being fired. Subsequently, an antistatic device 100 of Example 3 was obtained though a process the same as that of Example 1, except that gap processing was performed so that the gap distance became 15 μm after being fired and the protruding distance of the discharge inducing portion became 0.4 μm after being fired.

Example 4

The thickness of the stencil was changed so as to adjust the thickness of the opposing electrodes to 15 μm after being fired. Subsequently, an antistatic device 100 of Example 4 was obtained though a process the same as that of Example 1, except that gap processing was performed so that the gap distance became 35 μm after being fired and the protruding distance of the discharge inducing portion became 5 μm after being fired.

Example 5

The thickness of the stencil was changed so as to adjust the thickness of the opposing electrodes to 15 μm after being fired. Subsequently, an antistatic device 100 of Example 5 was obtained though a process the same as that of Example 1, except that gap processing was performed so that the gap distance became 35 μm after being fired and the protruding distance of the discharge inducing portion became 0.4 μm after being fired.

Example 6

The thickness of the stencil was changed so as to adjust the thickness of the opposing electrodes to 15 μm after being fired. Subsequently, an antistatic device 100 of Example 6 was obtained though a process the same as that of Example 1, except that gap processing was performed so that the gap distance became 50 μm after being fired and the protruding distance of the discharge inducing portion became 2 μm after being fired.

Example 7

The thickness of the stencil was changed so as to adjust the thickness of the opposing electrodes to 15 μm after being fired. Subsequently, an antistatic device 100 of Example 6 was obtained though a process the same as that of Example 1, except that gap processing was performed so that the gap distance became 50 μm after being fired and the protruding distance of the discharge inducing portion became 0.4 μm after being fired.

Example 8

The thickness of the stencil was changed so as to adjust the thickness of the opposing electrodes to 15 μm after being fired. Subsequently, an antistatic device 100 of Comparative Example 2 was obtained though a process the same as that of Example 1, except that gap processing was performed so that the gap distance became 65 μm after being fired and the protruding distance of the discharge inducing portion became 0.4 μm after being fired.

Comparative Example 1

The thickness of the stencil was changed so as to adjust the thickness of the opposing electrodes to 15 μm after being fired. Subsequently, an antistatic device 100 of Comparative Example 1 was obtained though a process the same as that of Example 1, except that gap processing was performed so that the gap distance became 35 μm after being fired and the protruding distance of the discharge inducing portion became 0 μm after being fired.

<Electrostatic Discharge Test>

Next, an electrostatic discharge test using a static electricity test circuit was performed on the antistatic device 100 of each of Examples 1 to 4 and an antistatic device of each of Comparative Examples 1 to 4, which had been obtained as described above. Table 1 shows the results of the test.

Figure 7:
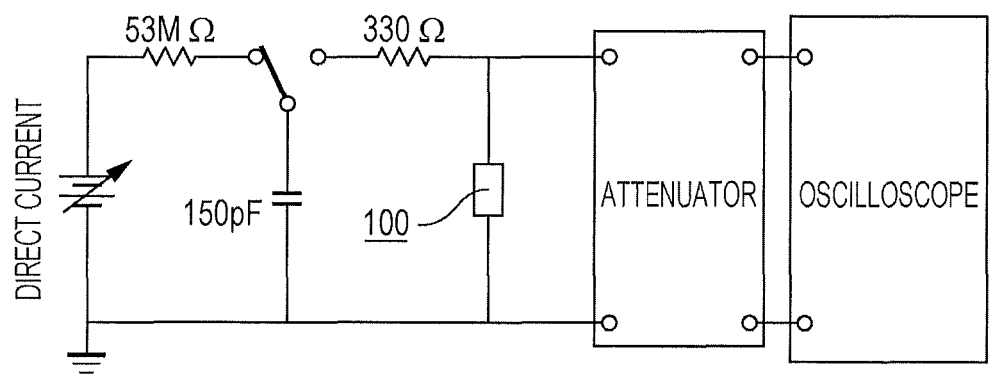
FIG. 7 is a diagram of a circuit used in en electrostatic discharge test.

The electrostatic discharge test was performed on the basis of an electrostatic discharge immunity test and a noise test specified in International Standard IEC61000-4-2 in conformity with a human body model (discharge resistance 330Ω, discharge capacitance 150 pF, applied voltage 8 kV, contact discharge). To be specific, as shown in a static electricity test circuit of FIG. 7, one of terminal electrodes of an antistatic device to be evaluated was grounded and an electrostatic pulse application unit was connected to the other electrode of the antistatic device. Then, a discharge gun was brought into contact with the electrostatic pulse application unit so as to apply an electrostatic pulse. The voltage of the electrostatic pulse applied was equal to or higher than the discharge start voltage.

The discharge start voltage was the voltage at which a static electricity absorbing effect occurred in a static electricity absorption waveform observed when an electrostatic test was performed while increasing the voltage from 0.4 kV at 0.2 kV intervals. The highest voltage in the static electricity absorption waveform was defined as the peak voltage. The capacitance was the capacitance (pF) at 1 MHz.

TABLE 1

| | ΔT Thickness of Opposing Electrodes (μm) | ΔG Gap Distance (μm) | ΔO Protruding Distance of Discharge Inducing Portion toward First Insulating Substrate (μm min) | Protruding Distance of Discharge Inducing Portion toward Second Insulating Substrate (μm min) | Capacitance Ave. [PF] | σ | Discharge Start Voltage Ave. [kV] | σ | Peak Voltage Ave (8 kV) |
|---|---|---|---|---|---|---|---|---|---|
| Example 1 | 8 | 5 | 2 | 2 | 0.4 | 0.54 | 1.5 | 0.23 | 246 |
| Example 2 | 8 | 15 | 2 | 2 | 0.15 | 0.0066 | 2.2 | 0.3 | 306 |
| Example 3 | 4 | 15 | 0.4 | 0.4 | 0.11 | 0.021 | 1.8 | 0.5 | 290 |
| Example 4 | 15 | 35 | 5 | 5 | 0.08 | 0.0047 | 4.3 | 0.38 | 485 |
| Example 5 | 15 | 35 | 0.4 | 0.4 | 0.007 | 0.0039 | 4.1 | 0.71 | 502 |
| Example 6 | 15 | 50 | 2 | 2 | 0.05 | 0.0059 | 7 | 0.7 | 844 |
| Example 7 | 15 | 50 | 0.4 | 0.4 | 0.05 | 0.008 | 6.7 | 0.94 | 798 |
| Example 8 | 15 | 65 | 0.4 | 0.4 | 0.05 | 0.0071 | 9 | 0.92 | 931 |
| Comparative Example 1 | 15 | 35 | 0 | 0 | 0.006 | 0.0095 | 3.4 | 1.21 | 445 |

From the results shown in Table 1, it was confirmed that the antistatic devices of Examples 1 to 8 each had a low capacitance of 0.4 pF or less and had high performance with which the devices could be used for a high-speed transmission system. Moreover, it was confirmed that the antistatic devices of Examples 1 to 8 each had a low peak voltage and small variations in the discharge start voltage.

INDUSTRIAL APPLICABILITY

As heretofore described, the antistatic device according to the present invention not only has a low capacitance, a low peak voltage, and small variations. The device can be widely and effectively used in electronic and electric devices and various apparatuses, facilities, systems, and the like equipped with such electronic and electric devices.

REFERENCE SIGNS LIST 11 first insulating substrate
11a insulating surface
12 second insulating substrate
21, 22 discharge electrode
31 discharge inducing portion
32 insulating inorganic material
33 conductive inorganic material
41 terminal electrode
100 antistatic device
ΔG gap distance
ΔO protruding distance of discharge inducing portion

The invention claimed is:

1. An antistatic device comprising:
a pair of discharge electrodes each having a thickness, the thicknesses of the discharging electrodes extending in a same direction; and
a discharge inducing portion having a length extending in the direction of the thicknesses of the discharging electrodes,
the pair of discharge electrodes being disposed opposite each other in a direction perpendicular to the thicknesses with a gap therebetween, the gap being located between a first insulating substrate and a second insulating substrate, the discharge inducing portion being disposed at opposing portions of the pair of discharge electrodes and in a region between the opposing portions, the length of the discharge inducing portion including a protruding length that protrudes in the direction of the thicknesses from a plane defined by the discharge electrodes, the plane being perpendicular to the thicknesses, the protruding length of the discharge inducing portion is ⅛ or more of the thickness of either of the discharge electrodes,
wherein the pair of discharge electrodes are formed on surfaces of the insulation substrates, and wherein the discharge inducing portion has a shape such that the discharge inducing portion protrudes toward the first insulating substrate and the second insulating substrate.

2. The antistatic device according to claim 1, the gap having a depth in the direction of the thicknesses, the depth being substantially the same as the length of the discharge induction portion.

3. The antistatic device according to claim 1, the discharge inducing portion being made of an insulating inorganic material.

* * * * *